United States Patent

Müller

[11] Patent Number: 5,469,123
[45] Date of Patent: Nov. 21, 1995

[54] FERROMAGNETIC ROOM SHIELDING FOR THE SUPERCONDUCTING HIGH FIELD MAGNET OF AN NMR SPECTROMETER

[75] Inventor: Wolfgang Müller, Karlsruhe, Germany

[73] Assignee: Bruker Analytische Messtechnik GmbH, Rheinstetten, Germany

[21] Appl. No.: 417,088

[22] Filed: Apr. 5, 1995

[30] Foreign Application Priority Data

May 5, 1994 [DE] Germany ............... 44 15 847.5

[51] Int. Cl.⁶ .................. H01F 7/00; H05K 9/00; G01V 3/00
[52] U.S. Cl. ............ 335/301; 324/318; 174/35 MS
[58] Field of Search ............ 335/301; 174/35 R, 174/35 MS; 324/318–320

[56] References Cited

U.S. PATENT DOCUMENTS

| | | |
|---|---|---|
| 4,651,099 | 3/1987 | Vinegar |
| 4,755,630 | 7/1988 | Smith et al |
| 5,220,302 | 6/1993 | Nunnally et al. ............ 335/301 |

OTHER PUBLICATIONS

Houston Advanced Research Center: "Introducing new technology for: Very High Field NMR Spectrometers".

Primary Examiner—Leo P. Picard
Assistant Examiner—Raymond M. Barrera
Attorney, Agent, or Firm—Bookstein & Kudirka

[57] ABSTRACT

In a magnetic shielding for a superconducting magnetic coil (2) arranged on the inside of a cryostat (1) and having a vertical axis for the production of a static magnetic field with a homogeneity of $<10^{-7}$ in an investigational volume (V) of a nuclear magnetic resonance (NMR) spectrometer, the shielding is a room shielding located at a separation from the cryostat (1), which includes at least two ferromagnetic, horizontally arranged plates (3, 4) of which one is arranged below and other above the cryostat (1), whereby the separation of the upper plate (3) from the center of the investigational volume (V) is approximately 1.5 to 3 times, preferentially approximately twice, as large as the separation (h) of the lower plate (4) from the center of the investigational volume (V), and vertical ferromagnetic side elements (5) are provided for which magnetically connect the upper plate (3) and the lower plate (4) and the upper plate (3) contains 1.5 times to 3 times, preferentially twice as much ferromagnetic material as the lower plate (4). In this fashion the magnetic field homogeneity is maintained and no significant forces occur during operation of the magnetic coil (2).

5 Claims, 6 Drawing Sheets

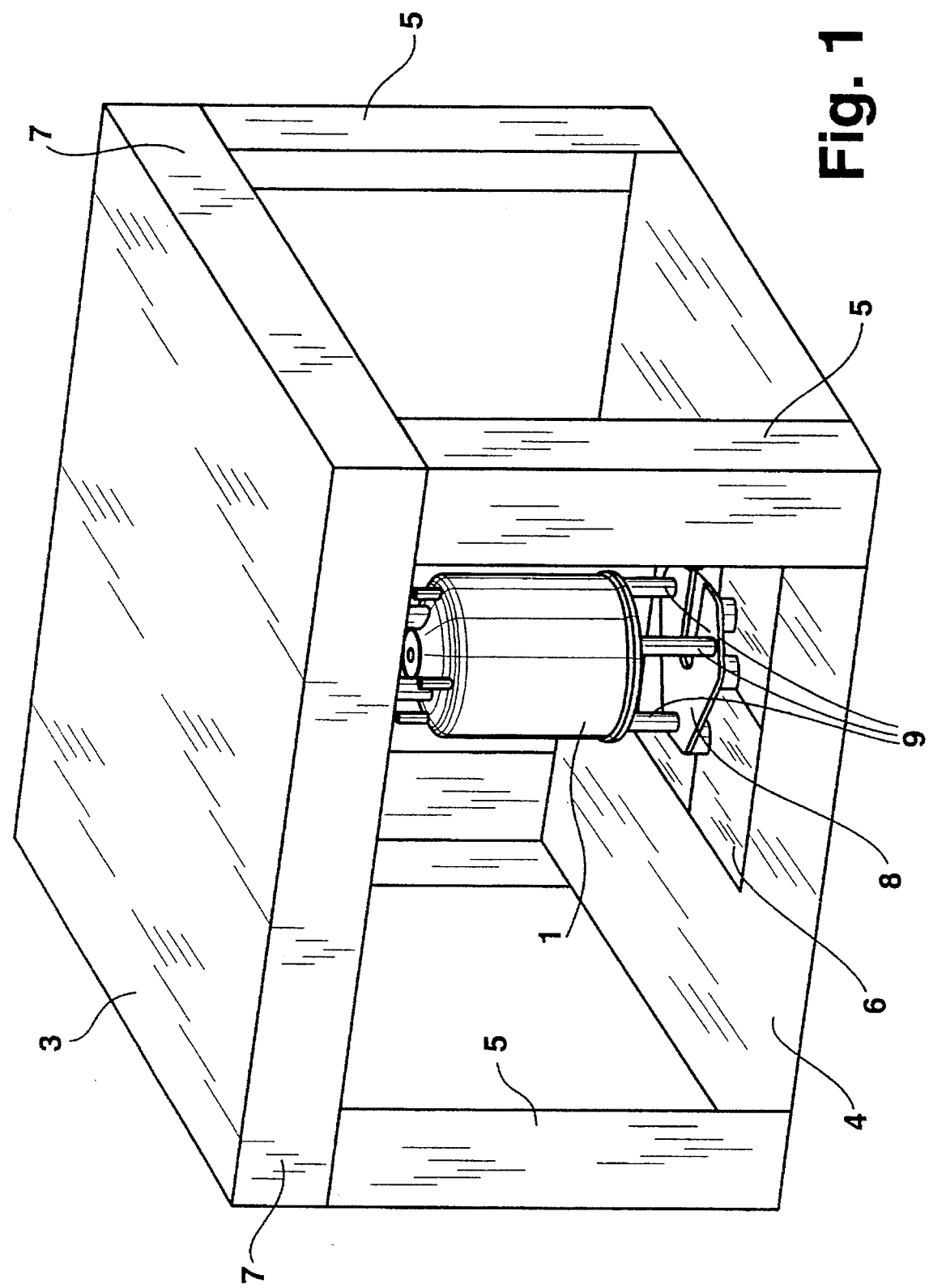

FERROMAGNETIC ROOM SHIELDING FOR THE SUPERCONDUCTING HIGH FIELD MAGNET OF AN NMR SPECTROMETER

BACKGROUND OF THE INVENTION

The invention concerns a magnetic shielding for a superconducting magnetic coil arranged on the inside of a cryostat and having a vertical axis for the production of a static magnetic field with a homogeneity of $<10^{-7}$ in an investigational volume of a nuclear magnetic resonance (NMR) spectrometer.

A magnetic shielding of this kind is known in the art from the company brochure "Introducing new technology for Very High Field NMR Spectrometers", Houston Advanced Research Center, 4800 Research Forest Drive, The Woodlands, Tex. 77381, USA, 1993.

Although different types of magnetic shields exist in the area of NMR tomography, room shieldings are not at all normally used in the analytic area of NMR. Sometimes one or several iron plates are arranged at a large distance from the room in which the relevant NMR analytic magnet is located, normally in the upper and lower floors relative to this room and effect a very incomplete and relatively ineffective shielding.

Completely enclosed or symmetric shielding chambers are known in the art of NMR tomography, for example, through the article "A Cylindrically Symmetric Magnetic Shield for a Large-Bore 3.0 Tesla Magnet", by Ewing et al., MRM 29, pp. 394–401, 1993. The NMR magnetic coil lies, with these types of closed and symmetric tomography shields, at the symmetry center of the entire configuration. For geometric reasons it is not possible to symmetrically arrange a room shielding for NMR analytic magnets, since the analytic magnet cryostat requires substantially more room in the upward direction than towards the floor of the room. If one then, with normal room sizes (for example 3 m ceiling height for an analytic laboratory), attempts to construct a magnetic room shielding through the use of iron plates introduced in the ceiling and in the floor, one would, in order to arrange the NMR analytic magnet symmetrically with respect to the ceiling and the floor, either have to completely reconstruct the cryostat or eliminate the conventional legs of the cryostat, whereby access to the NMR apparatus from below would no longer be possible. With normal cryostats a symmetric shielding solution is only conceivable with particularly high rooms (approx. 4 m ceiling height) or with the use of an iron plate configured approximately 1 m above the flooring of the next upper floor which would be extremely difficult and not economically sensible.

Since the homogeneity of the static magnetic field produced in NMR analytic applications ($\leq 10^{-7}$) must exceed that of tomography magnet systems (approx. $10^{-4}$ to $10^{-5}$) for an NMR analytic magnet, a simple asymmetric room shielding configuration is not usable. Furthermore, such an asymmetric configuration would cause enormous forces on the shielding elements so that, for this reason alone, an asymmetric room temperature shielding for NMR analytic magnets constructed with simple ferromagnetic plates on the floor and on the ceiling of the room being shielded can be ruled out.

Another conceivable possibility would be a symmetric shielding cooled in the helium bath of the cryomagnet. Towards this end it would, however, be necessary to substantially modify the magnet system as well as the cryostat compared to the usual conventional devices so that existing magnet or cryostat designs could not be utilized.

It is therefore the purpose of the present invention to create a magnetic shielding for an NMR analytic magnet of the above mentioned kind which can be realized for conventional existing magnet coils and cryostat systems without major modification, whereby neither increased force build-up problems nor significant distortion of the homogeneity of the produced magnetic field occur.

SUMMARY OF THE INVENTION

This purpose is achieved in accordance with the invention in a manner which is as surprisingly simple as it is effective in that the shielding is a room shielding located at a separation from the cryostat, which includes at least two ferromagnetic, horizontally arranged plates of which one is arranged below and other above the cryostat, whereby the separation of the upper plate from the center of the investigational volume is approximately 1.5 to 3 times, preferentially approximately twice, as large as the separation of the lower plate from the center of the investigational volume, and vertical ferromagnetic side elements are provided for which magnetically connect the upper plate to the lower plate and the upper plate contains 1.5 times to 3 times, preferentially twice as much ferromagnetic material as the lower plate.

It is extremely surprising that with the above mentioned measure using the solution in accordance with the invention both the force problem as well as the physically independent problem of static magnetic field homogeneity distortions are avoided utilizing an asymmetric iron shielding in that the upper shielding plate is spatially further removed from the symmetry center of the magnet system but contains more ferromagnetic material than the lower plate.

An embodiment of the magnetic shielding for NMR analytic magnets in accordance with the invention is preferred with which the lower plate lies directly on the floor of the room containing the cryostat. Compared to conceivable solutions having a lower plate raised with respect to the floor of the room, this configuration is the simplest to realize.

An embodiment is particularly preferred with which the floor plate exhibits a hole which is arranged preferentially symmetrically below the cryostat. In this fashion, on the one hand, a magnetic field independent shielding effect can be achieved and, on the other hand, the plate thickness of the upper and the lower plates can be equal, whereby the mass distribution in accordance with the invention is realized by sizing of the opening in the bottom plate.

Instead of an opening in the lower plate, the mass distribution in accordance with the invention can also be achieved through differing upper and the lower plate thicknesses and/or through the differing spatial extensions of the plates, whereby a hole can also be additionally provided for. Solutions are also conceivable with which the plates are replaced by struts or exhibit a plurality of holes, openings, rings etc. An arbitrary number of possibilities therefore exist for realizing the mass distribution between the upper and the lower plates in accordance with the invention.

In a particularly simple embodiment of the invention, for normal parallelepiped-shaped rooms, the side elements comprise four columns made from ferromagnetic material arranged in the corners of the room containing the cryostat and extending from the floor to the ceiling.

A particularly good shielding effect with respect to the upper floor can be achieved by providing for a canopy-apron made from ferromagnetic material running around and arranged below the upper plate.

Further advantages of the invention can be derived from the description and the drawing. The above mentioned features and those to be further explained below in accordance with the invention can be utilized individually or collectively in arbitrary combination. The embodiments described and shown are not to be considered is an exhaustive enumeration, rather have exemplary character only.

The invention is represented in the drawing and will be more closely described and explained with reference to concrete embodiments:

BRIEF DESCRIPTION OF THE DRAWING

FIG. 1 shows, in accordance with the invention, perspective representation of the magnetic shielding of an NMR analytic magnet having a cryostat;

DESCRIPTION OF THE PREFERRED EMBODIMENT

Figure 2A:
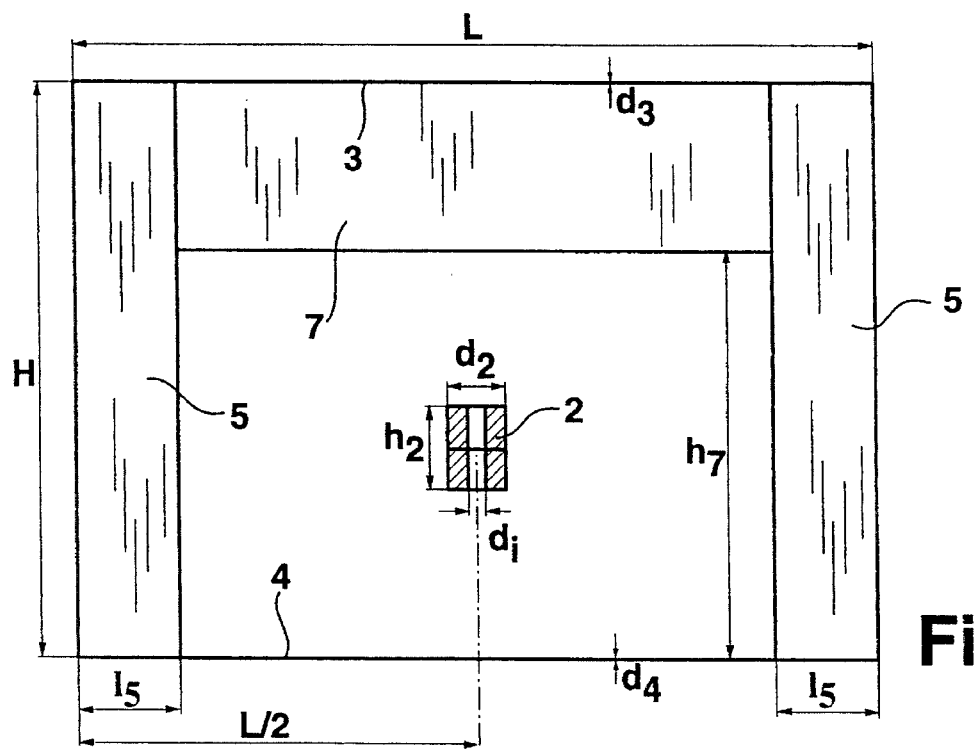
FIG. 2a) shows a cut through a vertical middle plane of a magnetic shielding in accordance with the invention having an indicated magnet coil.

A cryostat 1 is represented in FIG. 1 which contains a superconducting magnet, not visible in the figure, having a vertical axis for the production of a homogeneous static magnetic field for NMR spectroscopy. A room shielding is located at a separation from the cryostat 1 which, in the embodiment shown in FIG. 1, comprises a horizontally arranged upper ferromagnetic plate 3, a likewise horizontally arranged lower ferromagnetic plate 4 as well as four vertical ferromagnetic side elements 5 in the form of posts. The lower plate 4 lies on the floor of the room containing the cryostat 1. The side elements 5 are arranged in the four corners of the parallelepiped-shaped room and the upper plate 3 is adjacent to the ceiling of the room. A peripherally running canopy-apron 7 comprising ferromagnetic material is provided on all four walls of the room below the upper plate 3. The lower plate 4 exhibits a square hole 6 symmetrically below the cryostat 1. A vibrationally damped base plate 8 is arranged in the hole 6 upon which the cryostat 1 is supported on three support posts 9.

FIG. 2a shows a cut through a vertical middle plane of a magnetic shielding in accordance with the invention having an analytic magnet coil 2 whose center of homogeneity is located at a height h above the base plate 4. The magnet coil 2 has a vertical height $h_2$, an outer diameter $d_2$ and a bore diameter $d_i$. The separation to the coil center assumes a value $L/2$ with respect to each side of a room having a square bottom area and side length L, as suggested in FIG. 2b. Two column-like ferromagnetic side elements 5 having a length $l_5$ and a height H corresponding to the separation between the upper plate 3 and the lower plate 4 are shown at the left and the right outside of the plane of the cut of FIG. 2a in, figuratively speaking, the background. Likewise a peripheral canopy-apron 7 is visible in the background of FIG. 2a extending downward from the upper plate 3 to a height $h_7$ above the lower plate 4.

Figure 2B:
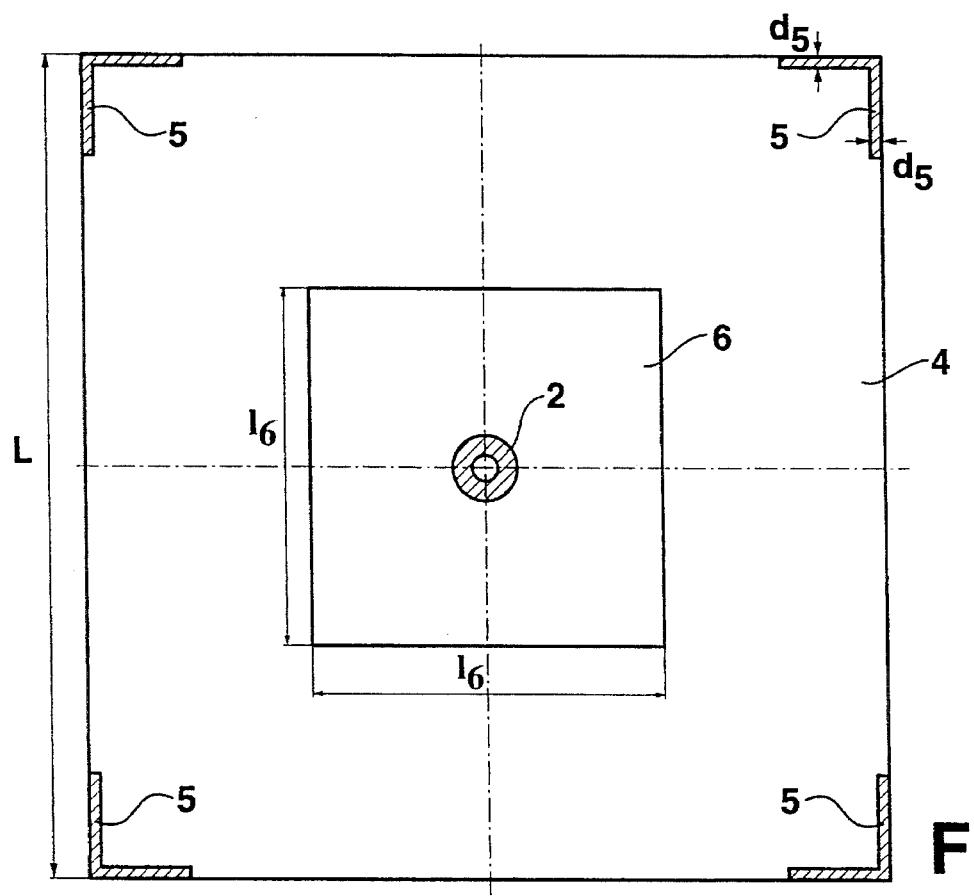
FIG. 2b) shows a cut through a horizontal middle plane of a magnetic shielding in accordance with the invention having an indicated magnet coil.

FIG. 2b shows a cut through the horizontal middle plane at the height h above the lower plate 4. A square hole 6 in the lower plate 4 of side length $l_6$ can be seen in, figuratively speaking, the background as viewed from above, which is arranged symmetrically below the magnet coil 2.

The upper plate 3 has a thickness $d_3$, the lower plate 4 a thickness $d_4$ and the side elements 5 each have a thickness $d_5$.

Figure 3:
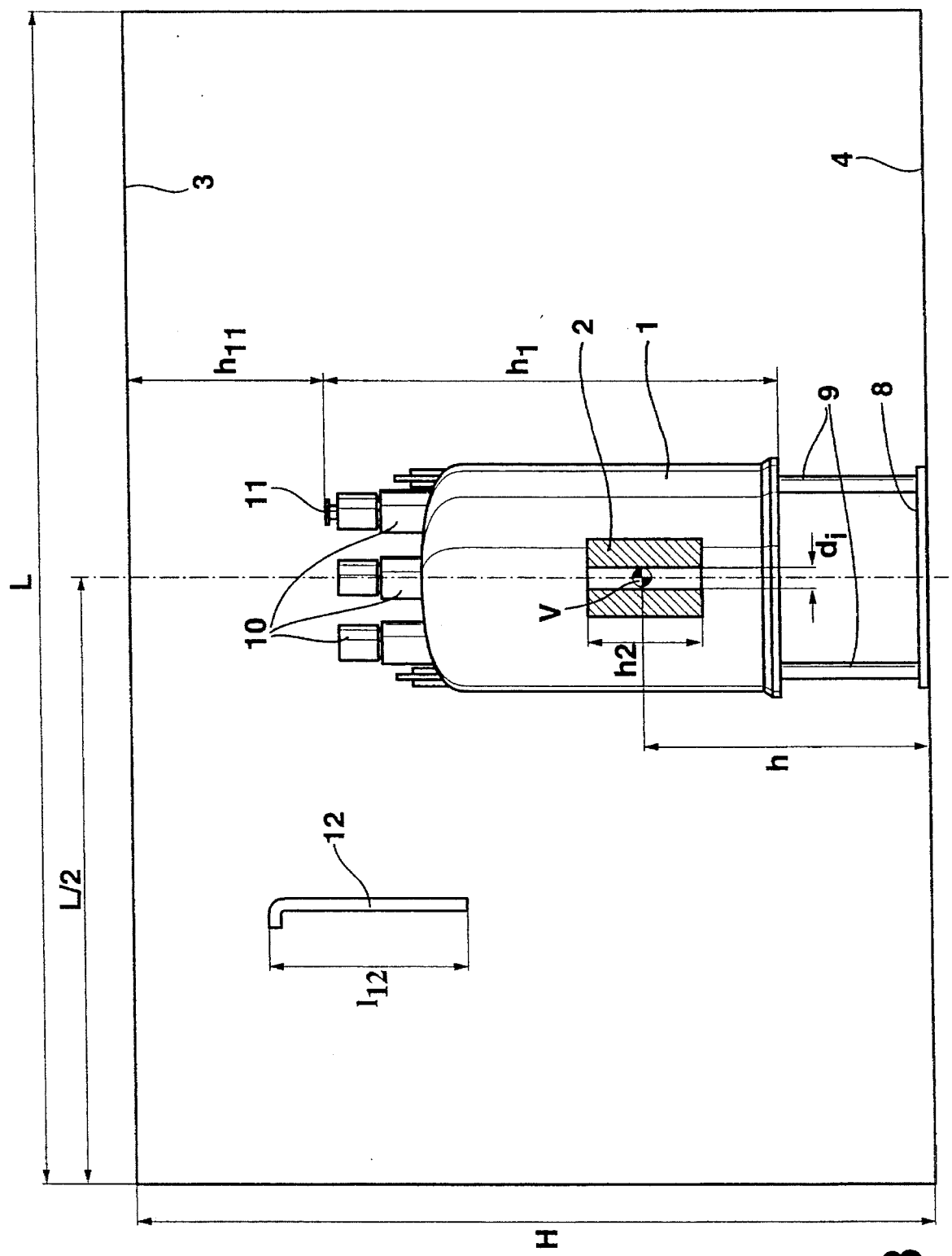
FIG. 3 shows a cut through a vertical middle plane of a magnetically shielded room having a helium cryostat and an indicated analytic magnet coil.

The cryostat 1 is shown in FIG. 3 for reasons of clarity in a schematic cut through a vertical middle plane of the magnetically shielded room in accordance with the invention. The dimensioning corresponds to the embodiment shown in FIG. 2a.

The cryostat 1 has three towers 10 which serve for introducing and releasing the liquid helium as well as for operations on the magnet coil 2. The upper flange 11 of the tower 10 arranged at the right in FIG. 3 has a separation $h_{11}$ with respect to the upper plate 3.

Also schematically shown in the left upper quadrant of FIG. 3 is a conventional current rod 12 for introducing the superconducting current into the magnet coil 2 which exhibits a length $l_{12}$. In order that the current rod be introduceable through the flange 11 into the cryostat 1, the height $h_{11}$ must be at least as large as the length $l_{12}$ of the current rod 12. The same is true for feeding and suction devices for filling and releasing liquid helium. For this reason the height h of the investigational volume V above the bottom plate 4 cannot be increased so that the coil 2 must be unsymmetrically arranged between the upper plate 3 and the lower plate 4.

In a concrete embodiment the following values result for the named quantities in mm: H=2850, h=1000, $h_2$=400, $h_7$=2000, $h_{11}$=700; L=4000, L/2=2000, $l_5$=500, $l_6$=1770, $l_{12}$=700; $d_i$=72, $d_2$=280, $d_3$=$d_4$=10, $d_5$=40. The height $h_1$ of the cryostat 1 from its lower edge up to the upper edge of the flange 11 assumes a value of $h_1$=1600 mm.

Figure 4C:
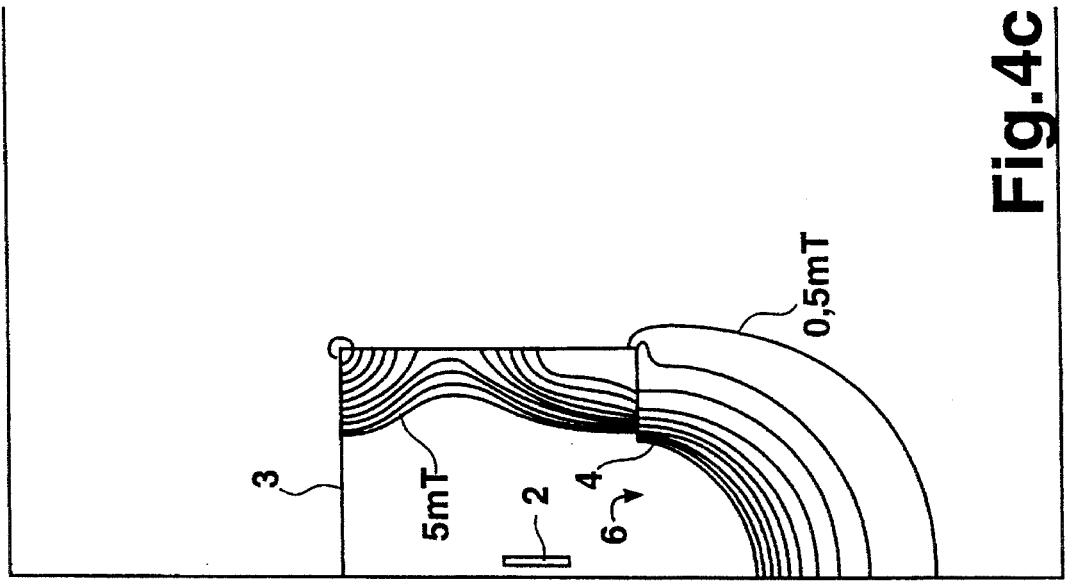
FIG. 4c) shows vertical cuts through a half room containing half of the magnet coil having lines of constant magnetic stray field with closed ceiling plate and hole in the floor plate below the coil.
Figure 4B:
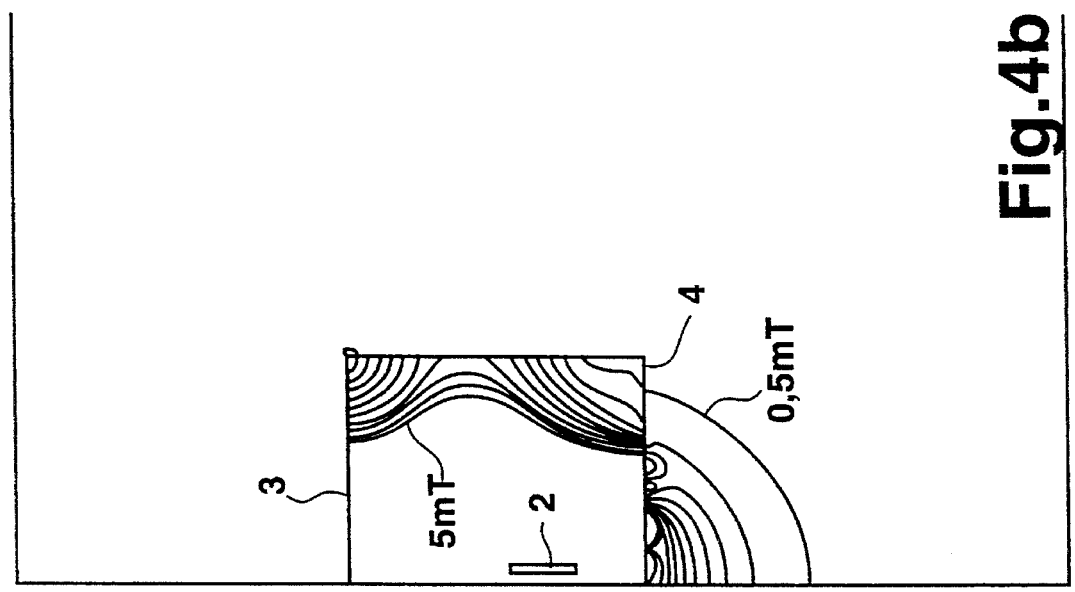
FIG. 4b) shows vertical cuts through a half room containing half of the magnet coil having lines of constant magnetic stray field with closed floor and ceiling plates.
Figure 4A:
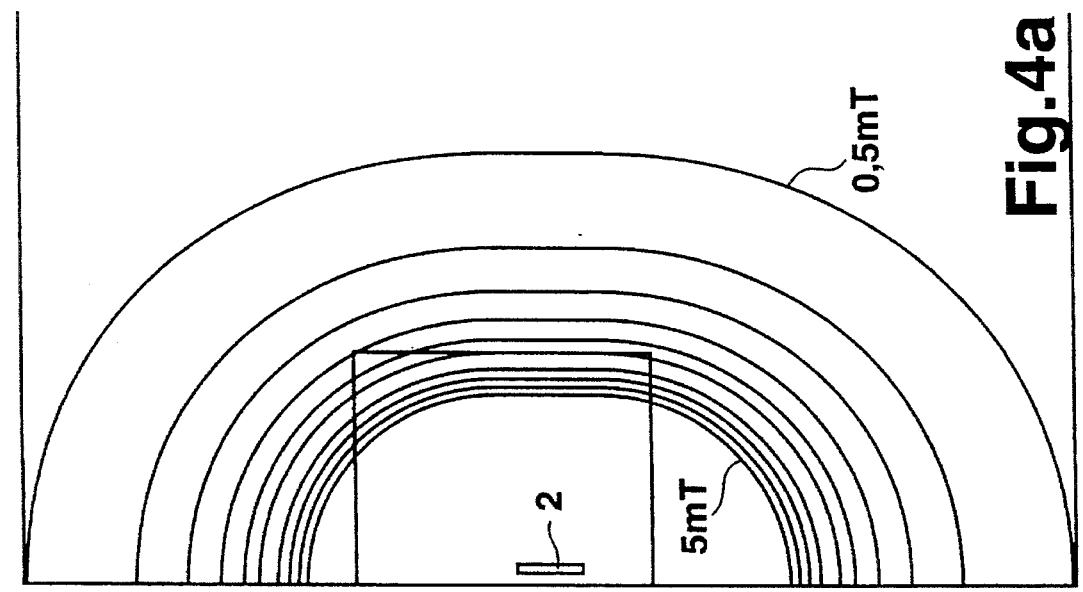
FIG. 4a) shows vertical cuts through a half room containing half of the magnet coil having lines of constant magnetic stray field without shielding.

A schematic vertical cut of a half plane of the cross sectional plane of FIG. 3 is shown in FIG. 4a, whereby the half plane extends from the center of the coil 2. FIG. 4a shows calculated stray field lines for a configuration without any shielding. The outer most stray field line shown is a 0.5 mT-line, whereas the inner most stray field line represented signifies a stray field of magnitude 5 mT. The 0.5 mT stray field lines each exhibit, above and below, a separation of 4.8 m from the center of the coil 2. Towards the side, the separation of the 0.5 mT stray field line from the center of the coil 2 is only 3.9 m.

A significant improvement in the shielding effect is shown in FIG. 4b, wherein the calculation of the stray field lines assumes a ferromagnetic upper plate 3 and ferromagnetic lower plate 4. This configuration completely shields the magnetic field produced in the magnetic coil 2 upwardly and sidewardly, whereas magnetic stray field leaves the region of the coil 2 in the lower direction, whereby the 0.5 mT stray field line nevertheless exhibits a maximum separation of only 2.5 m below the coil 2. One also notices that the stray field lines are concentrated at a plurality of points in the base plate 4 which leads to inhomogeneities in the magnetic field produced by the magnet coil 2 which will be discussed below.

FIG. 4c finally shows a configuration which can be calculated with the shielding data shown in FIG. 2a and FIG. 2b. In particular, a hole 6 is provided for in the base plate 4.

The shielding effect of FIG. 4c is perfect in the upper and the sidewards directions in each case, whereas stray field escapes to a certain extent in the downwards direction. The separation of the 0.5 mT stray field line from the center of the magnet coil 2 assumes a value, in this embodiment, of 3.7 m. It is thereby somewhat larger than in the embodiment shown in FIG. 4b having an shielding configuration without a hole 6 in the base plate 4, however, is nevertheless significantly better than the non-shielded configuration shown in FIG. 4a.

Figure 5A:
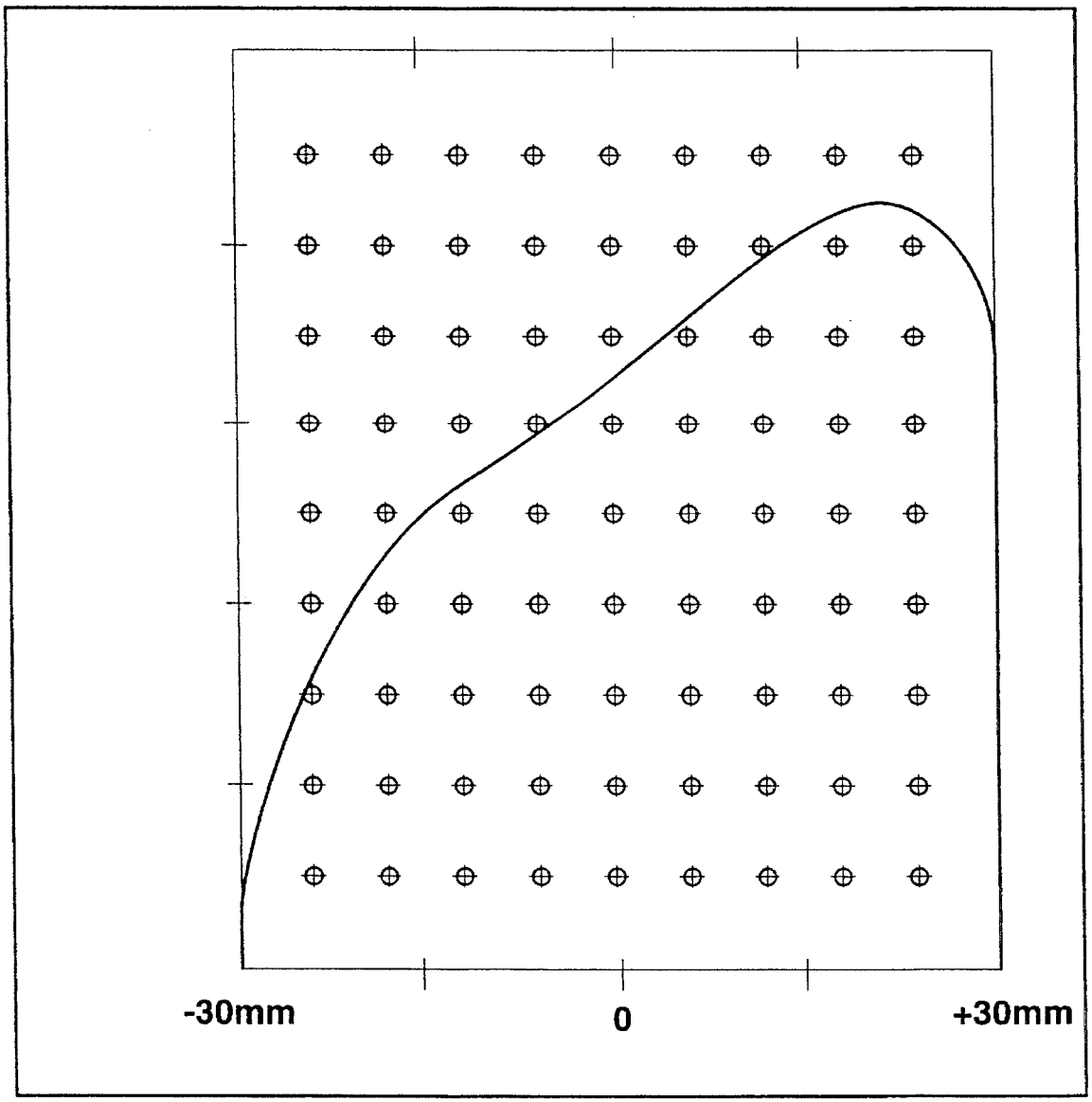
FIG. 5a) shows the homogeneity dependence of a magnetic field extending radially outward from the mid-point of the investigational volume with a shielding having a closed bottom and ceiling plate corresponding to FIG. 4b)

The outward radial field dependence from a middle point 0 at the center of the investigational volume V to a separation of ±30 mm in each case is shown in FIG. 5a for a shielding configuration in accordance with FIG. 4b. The maximal field deviation in FIG. 5a assumes a value of approximately 10 mT. As can be clearly seen in FIG. 5a, the field at the center of the investigational volume is, with closed shielding plates, no longer homogeneous rather has a nearly linear superimposed gradient in the central region of the investigational volume.

Figure 5B:
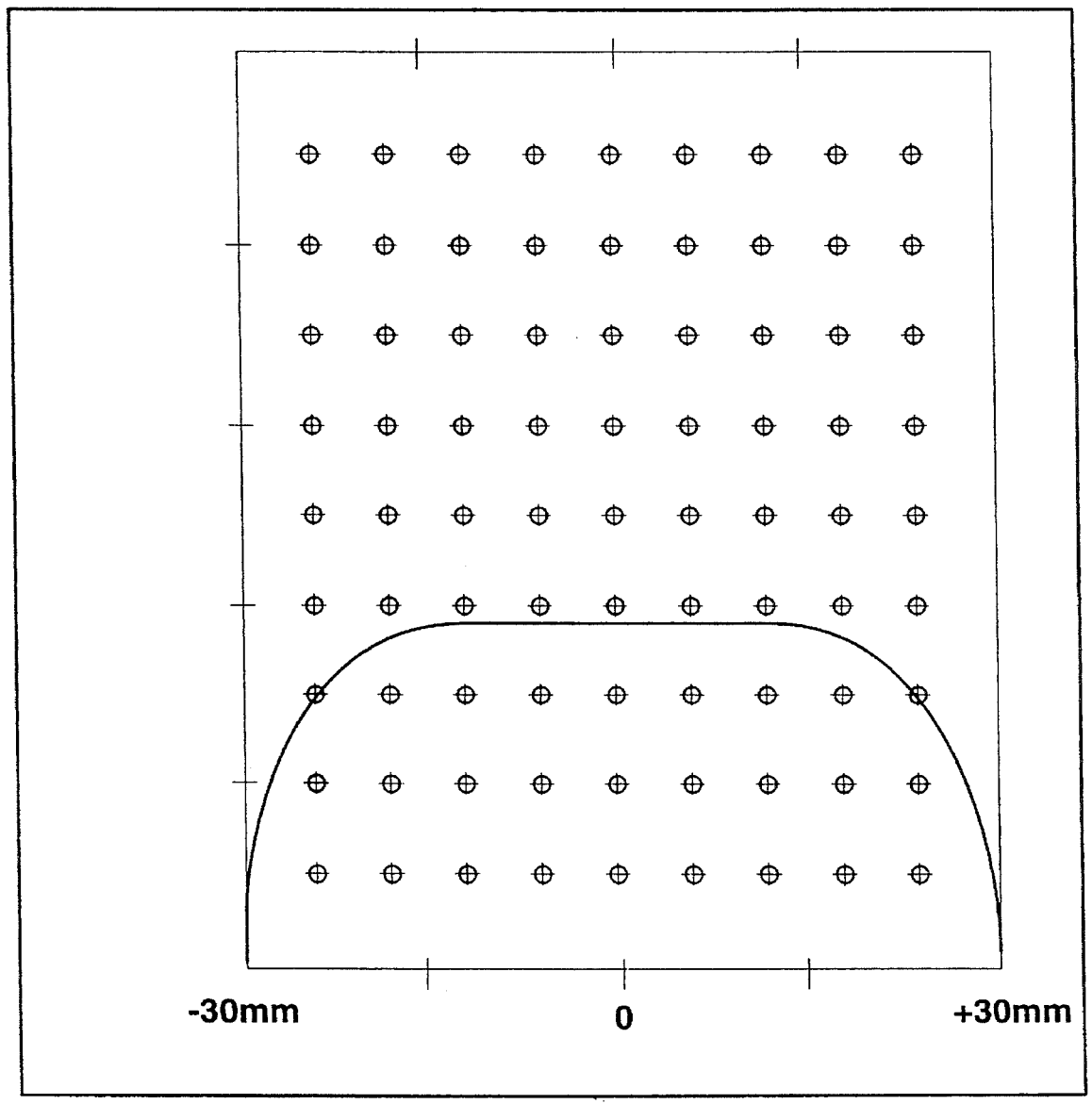
FIG. 5b) shows the homogeneity dependence of a magnetic field extending radially outward from the mid-point of the investigational volume in a configuration having perforated bottom plates corresponding to FIG. 4c) or FIG. 1.

In FIG. 5b, where the magnetic field dependence is plotted with a shielding configuration having a hole in the base plate 4 corresponding to FIG. 4c or FIGS. 1 or 2, one clearly sees a particularly high magnetic field homogeneity in the center of the investigational volume. Since, particularly in the analytic area, very high demands on the homogeneity of the static magnetic field must be made, the somewhat reduced shielding effect with regard to the stray field produced by the coil configuration as clearly shown in FIG. 4c is acceptable. In addition, an integration of the forces acting on the shielding along a closed path via the shielding elements results, for the configuration having a closed base plate 4, in a force of approximately 3200 N which approximately corresponds to the weight of the magnet coil 2 (mass approx. 300 kg), whereas the configuration having a hole 6 in the base plate 4 in accordance with FIG. 2, FIG. 4c and FIG. 5b exhibits a force on the shielding elements of approximately 45N when switching on the NMR magnetic field, which is negligible.

We claim:

1. A room magnetic shielding for a superconducting magnet located inside a cryostat and having a vertical axis, the magnet producing a static magnetic field having a homogeneity of $<10^{-7}$ within an investigational volume of an NMR spectrometer, the magnetic shielding comprising:

a first horizontal ferromagnetic means, having a first amount of ferromagnetic material, located below the cryostat at a first separation from a center of the investigational volume;

a second horizontal ferromagnetic means, having a second amount of ferromagnetic material, located above the cryostat at a second separation from the center of the investigational volume which is 1.5 to 3 times the first separation, the second amount of ferromagnetic material being 1.5 to 3 times the first amount of ferromagnetic material; and vertical ferromagnetic side means magnetically connecting the first and second ferromagnetic means.

2. The room magnetic shielding of claim 1, wherein the first ferromagnetic means is proximate to a floor of a room containing the cryostat.

3. The room magnetic shielding of claim 1, wherein the first ferromagnetic means has a hole located symmetrically below the cryostat.

4. The room magnetic shielding of claim 1, wherein the vertical ferromagnetic means comprise four post means arranged proximate to corners of a room containing the cryostat and extending from a floor to a ceiling of the room.

5. The room magnetic shielding of claim 1, further comprising a peripheral canopy-apron means made from ferromagnetic material and extending vertically downward from the second ferromagnetic means.

\* \* \* \* \*